（12） United States Patent
Ozawa et al.

(10) Patent No.: US 8,097,954 B2
(45) Date of Patent: Jan. 17, 2012

(54) ADHESIVE LAYER FORMING A CAPACITOR DIELECTRIC BETWEEN SEMICONDUCTOR CHIPS

(75) Inventors: Kaname Ozawa, Kawasaki (JP); Mitsutaka Sato, Kawasaki (JP); Yoshiyuki Yoneda, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 650 days.

(21) Appl. No.: 11/508,289

(22) Filed: Aug. 23, 2006

(65) Prior Publication Data

US 2007/0001298 A1 Jan. 4, 2007

Related U.S. Application Data

(63) Continuation of application No. PCT/JP2004/007943, filed on Jun. 7, 2004.

(51) Int. Cl.
*H01L 23/58* (2006.01)
(52) U.S. Cl. .......... 257/777; 257/686; 257/E25.013
(58) Field of Classification Search .......... 257/686, 257/777
See application file for complete search history.

(56) References Cited

U.S. PATENT DOCUMENTS

| 5,629,838 A * | 5/1997 | Knight et al. ........... 361/782 |
| 5,708,569 A * | 1/1998 | Howard et al. .......... 361/760 |
| 6,851,183 B2 * | 2/2005 | Quinlan et al. .......... 29/832 |
| 6,916,719 B1 * | 7/2005 | Knight et al. ........... 438/381 |
| 7,064,444 B2 | 6/2006 | Lee et al. |
| 2003/0107119 A1 * | 6/2003 | Kim ..................... 257/686 |
| 2003/0189256 A1 * | 10/2003 | Corisis et al. ........... 257/777 |
| 2004/0251529 A1 * | 12/2004 | Lee et al. ............... 257/686 |
| 2005/0077546 A1 * | 4/2005 | Neaves .................. 257/210 |

FOREIGN PATENT DOCUMENTS

| JP | 02-032559 A | 2/1990 |
| JP | 5-259374 A | 10/1993 |
| JP | 5-259375 A | 10/1993 |
| JP | 5-326838 A | 12/1993 |
| JP | 5-335501 A | 12/1993 |
| JP | 8-162608 A | 6/1996 |
| JP | 11-31696 A | 2/1999 |
| JP | 2002-170920 A | 6/2002 |
| JP | 2004-99833 A | 4/2004 |
| JP | 2004-327993 A | 11/2004 |

OTHER PUBLICATIONS

International Search Report of PCT/JP2004/007943 date of mailing Aug. 31, 2004.
Japanese Office Action dated Jul. 7, 2009, issued in corresponding Japanese patent application No. 2006-514364.

* cited by examiner

*Primary Examiner* — Wael Fahmy
*Assistant Examiner* — Abul Kalam
(74) *Attorney, Agent, or Firm* — Westerman, Hattori, Daniels & Adrian, LLP

(57) ABSTRACT

A semiconductor device of the invention includes a substrate in which a power-supply electrode and a ground electrode are provided. A first semiconductor chip is disposed over the substrate and has a first conductor layer formed on a surface facing a second semiconductor chip. A second conductor layer is disposed over the first semiconductor chip and has a second conductor layer formed on a surface facing the first semiconductor chip. And an adhesive layer is disposed between the first conductor layer and the second conductor layer and bonds together the first semiconductor chip and the second semiconductor chip. In the semiconductor device, the adhesive layer and the first and second conductor layers function as a capacitor.

6 Claims, 16 Drawing Sheets

PREVENTION OF
RADIATION NOISE

ADHESIVE LAYER FORMING A CAPACITOR DIELECTRIC BETWEEN SEMICONDUCTOR CHIPS

CROSS-REFERENCE TO RELATED APPLICATION

This application is a U.S. continuation application which is filed under 35 USC 111(a) and claims the benefit under 35 USC 120 and 365(c) of International Application No. PCT/JP2004/007943, filed on Jun. 7, 2004, the entire contents of which are hereby incorporated by reference.

BACKGROUND OF THE INVENTION

1. Field of the Invention

The present invention relates to a semiconductor device with a built-in capacitor, and a method of manufacturing the same.

2. Description of the Related Art

During operation of a semiconductor device with a semiconductor chip, such as LSI (large-scale integration) chip, which is mounted on the substrate of the electronic device, the semiconductor chip may be electrically damaged due to the transient current produced during a switching operation of an internal circuit of the semiconductor chip.

For this reason, in the vicinity of the semiconductor device or the semiconductor chip, a capacitor (capacitive element) is inserted between the power supply terminal and the ground terminal, and this capacitor serves to absorb and accumulate (or bypass) the electric charge of the transient current in order to avoid the damage of the semiconductor device or the semiconductor chip. This capacitor is called a decoupling capacitor or a bypass capacitor.

On the other hand, when the internal circuits of the semiconductor chip are highly integrated and a high-frequency signal is used by the LSI, there is a possibility that the LSI malfunctions due to the switching noises (or noises resulting from changes of the power supply potential or the ground potential due to the transient current) occurring in the semiconductor package. Changes of the power supply potential due to the transient current may be called power supply bounce, and changes of the ground potential due to the transient current may be called ground bounce. In order to reduce the switching noises, the application of a decoupling capacitor is necessary.

FIG. 1 shows the composition of a ceramic package type semiconductor device as one of the conventional semiconductor devices having the decoupling capacitor mentioned above. For example, see Japanese Laid-Open Patent Application No. 05-335501 and Japanese Laid-Open Patent Application No. 11-031696.

As shown in FIG. 1, in the semiconductor device 30, a semiconductor chip 34 is accommodated in a cavity 33 which is formed by a ceramic substrate 31 and a cap 32. Among the external-connection terminals of the ceramic package, a ground terminal 35 and a power supply terminal 36 are respectively connected to a ground electrode 38 and a power-supply electrode 39 of the semiconductor chip 34 by wires 37, such as gold wires.

In the semiconductor device 30, conductor layers 42 and 43 with a dielectric layer 41 interposed between the conductor layers are disposed between the semiconductor chip 34 and the ceramic substrate 31. The conductor layer 42 is connected to a power supply terminal and the conductor layer 43 is connected to a ground terminal so that a decoupling capacitor 40 is formed.

In this manner, a decoupling capacitor with a comparatively large capacitance can be formed by disposing the capacitive elements between the semiconductor chip 34 and the ceramic substrate 31 in the vicinity of the semiconductor chip 34.

However, in the case of the ceramic package type semiconductor device mentioned above, it is difficult to take countermeasure against a large number of external-connection terminals of an LSI chip accompanied with high integration and advanced features of the LSI chip, and it does not fit miniaturization and weight saving of semiconductor device.

As one countermeasure against the large number of external-connection terminals of the LSI chip, the face-down bonding technique is utilized for mounting of a semiconductor chip. In the face-down bonding, the circuit formation surface of a semiconductor substrate is inverted as the bottom side surface. This technique is also called flip chip bonding.

FIG. 2 shows the composition of a decoupling capacitor provided in the face-down mounting type semiconductor device mentioned above. For example, see Japanese Laid-Open Patent Application No. 2002-170920.

As shown in FIG. 2, the semiconductor device 50 comprises a mounting substrate 51, and a first semiconductor chip 55 which is disposed on the mounting substrate 51 by connecting electrodes 54 of the first semiconductor chip 55 to electrode pads 52 of the mounting substrate 51 via solder balls 53.

The space (or clearance) is provided between the first semiconductor chip 55 and the mounting substrate 51, wherein no solder ball 53 is arranged, and a second semiconductor chip 57 incorporating a decoupling capacitor 56 is disposed in the space. In the second semiconductor chip 57, a signal wiring 58 is disposed at a location corresponding to the part where no solder ball 53 is arranged, and the signal wiring 58 is connected to the electrodes 54 of the first semiconductor chip 55.

In the case of the semiconductor device 50 shown in FIG. 2, it is necessary to arrange the second semiconductor chip 57, incorporating the decoupling capacitor, in the space of the first semiconductor chip 55 where no solder ball is arranged. Therefore, the size and form of the second semiconductor chip 57 will be restrained depending on the layout of the solder balls in the first semiconductor chip 55.

For this reason, it is necessary to customize the second semiconductor chip 57 for every model of the first semiconductor chip 55, which will cause the cost to increase. Moreover, a wafer process is needed preparation of the second semiconductor chip 57, which will cause the development period to increase.

On the other hand, as one countermeasure being taken against a large number of external-connection terminals of a semiconductor chip because of high integration and advanced features of the semiconductor chip as mentioned above, the structure in which the external connection terminals, such as solder balls, are arranged in an array formation is often utilized for the supporting substrate for supporting the semiconductor chip. The BGA (ball grid array) structure is commonly used as one of the above-mentioned structure.

FIG. 3 shows the composition of a conventional BGA type semiconductor device which incorporates a decoupling capacitor.

As shown in FIG. 3, the semiconductor device 70 comprises a supporting substrate (interposer) 73 wherein solder balls 72 are bonded to pads 71 that are arranged in an array formation on the back surface of the supporting substrate 73, and a semiconductor chip 75 which is disposed on the supporting substrate 73 and covered with an encapsulation resin 74.

The supporting substrate 73 is provided so that wiring layers are disposed on the surface and/or within the inside of an insulating substrate, such as glass epoxy. The surface wiring layer and the internal wiring layer are interconnected by interlayer-connection conductors, if needed.

Bonding pads 76 are disposed on the surface of the supporting substrate 73 and connected to a ground electrode 78 and a power-supply electrode 79 of the semiconductor chip 75 by wires 77.

In the above-mentioned semiconductor device 70, a conductor layer 81 and a conductor layer 82 with a dielectric layer 80 interposed between the conductor layers 81 and 82 are disposed between the semiconductor chip 75 and the supporting substrate 73. The conductor layer 81 is connected to the power supply terminal and the conductor layer 82 is connected to the ground terminal, so that a decoupling capacitor 83 is formed.

In this manner, a decoupling capacitor with a comparatively large capacitance can be formed by disposing the capacitor (capacitive elements) between the semiconductor chip 75 and the supporting substrate 73 near the location beneath the semiconductor chip 75.

However, in the case of the BGA type semiconductor device, it is necessary to connect the electrodes of the semiconductor chip to the electrodes/sockets of the electronic device through the bonding pads, the supporting substrate surface/internal layer wiring, and the external terminals (solder balls). If the conductor layer that is used as one electrode of the decoupling capacitor is formed on the supporting substrate 73, the conductor layer must have a comparatively wide area. For this reason, the space for arranging the wiring is limited. And, in order to secure the space for arranging the wiring, the size of the supporting substrate must be enlarged.

A conceivable technique for securing the space for arranging the wiring without changing the size of the supporting substrate 73 is to provide a multi-layer arrangement of the supporting substrate 73. However, the multilayer arrangement of the supporting substrate requires a complicated structure and it will cause the cost to increase.

Generally, the cost of a wiring substrate is equivalent to about 70 percent of the material cost of a semiconductor device package. It is desirable to avoid increase of the cost of a wiring substrate as much as possible.

In recent years, with miniaturization and high performance of electronic devices including a mobile phone and a PDA (personal digital assistant), there is the demand for further miniaturization and high performance of electronic parts, such as semiconductor devices carried on the electronic devices.

Not only the active component parts, such as semiconductor devices, but also the passive component parts, such as resistors, inductors, and capacitors, are carried on the electronic device. These passive component parts are needed for to stably operate the active component part like the semiconductor device, and they are disposed near or on the circumference of the semiconductor device on a wiring substrate (mother board) of the electronic device.

In order for further miniaturization of electronic devices, it is necessary to reduce the space for arranging the passive component parts as much as possible. Accordingly, reducing the occupation area of the capacitive elements, such as decoupling capacitors, as much as possible is also demanded.

SUMMARY OF THE INVENTION

According to one aspect of the invention, there is provided an improved semiconductor device in which the above-described problems are eliminated.

According to one aspect of the invention, there is provided one of a semiconductor device with a built-in decoupling capacitor and a method of manufacturing the same which are adapted for realizing miniaturization and high performance by using a simple, low cost semiconductor device structure.

In an embodiment of the invention which solves or reduces one or more of the above-mentioned problems, there is provided a semiconductor device comprising: a supporting substrate; a first semiconductor chip disposed over the supporting substrate; a second semiconductor chip or dummy chip disposed over the first semiconductor chip via a dielectric layer such that the first semiconductor chip and the second semiconductor chip or dummy chip are laminated over the supporting substrate via the dielectric layer; and a capacitor formed between the first semiconductor chip and the second semiconductor chip or dummy chip, the capacitor having the dielectric layer used as a dielectric material.

In an embodiment of the invention which solves or reduces one or more of the above-mentioned problems, there is provided a semiconductor device comprising: a supporting substrate; a first semiconductor chip disposed over the supporting substrate; a second semiconductor chip or dummy chip disposed over the first semiconductor chip via an adhesive layer such that the first semiconductor chip and the second semiconductor chip or dummy chip are laminated over the supporting substrate via the adhesive layer; and a capacitor formed between the first semiconductor chip and the second semiconductor chip or dummy chip, the capacitor having the adhesive layer used as a dielectric material.

In an embodiment of the invention which solves or reduces one or more of the above-mentioned problems, there is provided a method of manufacturing a semiconductor device, the method comprises the steps of: disposing a first semiconductor chip over a supporting substrate on which predetermined wiring layers and electrodes are formed, the first semiconductor chip having a surface on which a first electrode of a capacitor is formed; disposing a second semiconductor chip or dummy chip over the first semiconductor chip via an adhesive layer, the second semiconductor chip or dummy chip having a surface on which a second electrode of the capacitor is formed; and connecting the first electrode and the second electrode of the capacitor to a power-supply electrode and a ground electrode on the supporting substrate respectively.

In an embodiment of the invention which solves or reduces one or more of the above-mentioned problems, there is provided a method of manufacturing a semiconductor device, the method comprising the steps of: disposing a semiconductor chip over a supporting substrate on which predetermined wiring layers and electrodes are formed, the semiconductor chip having a surface on which a first electrode of a capacitor is formed; disposing a dummy chip over the first semiconductor chip via an adhesive layer, the dummy chip having a surface on which a second electrode of the capacitor is formed; and connecting the first electrode and the second electrode of the capacitor to a power-supply electrode and a ground electrode on the supporting substrate respectively.

In an embodiment of the semiconductor device of the invention, the electrode layers with the insulator layer (used as the dielectric layer) being interposed are disposed between the two semiconductor chips arranged in a lamination state, or between the semiconductor chip and the dummy chip arranged in a lamination state, so that a capacitor (capacitive element) is formed.

This capacitor functions as a decoupling capacitor and contributes also to high performance of the semiconductor device. According to this invention, it is not necessary to dispose the electrodes which constitute the capacitive element on the supporting substrate which supports the semiconductor chip.

There is no need for enlargement of the supporting substrate concerned and there is no necessity of increasing the number of layers of the supporting substrate, which will not cause the cost of the supporting substrate to increase. Accordingly, it is possible to provide a semiconductor device with a built-in capacitor which realizes miniaturization and high performance by using a small-size semiconductor device structure with low cost.

DETAILED DESCRIPTION OF PREFERRED EMBODIMENTS

A description will now be given of the preferred embodiments of the invention with reference to the accompanying drawings.

Figure 1:
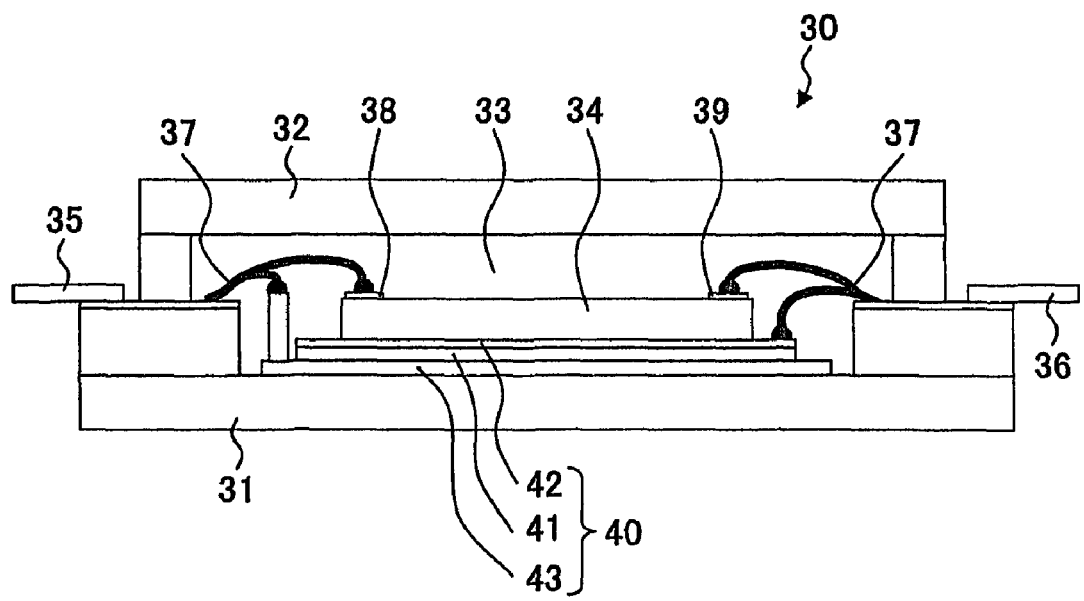
FIG. 1 is a cross-sectional view showing the composition of a conventional ceramic package type semiconductor device.
Figure 2:
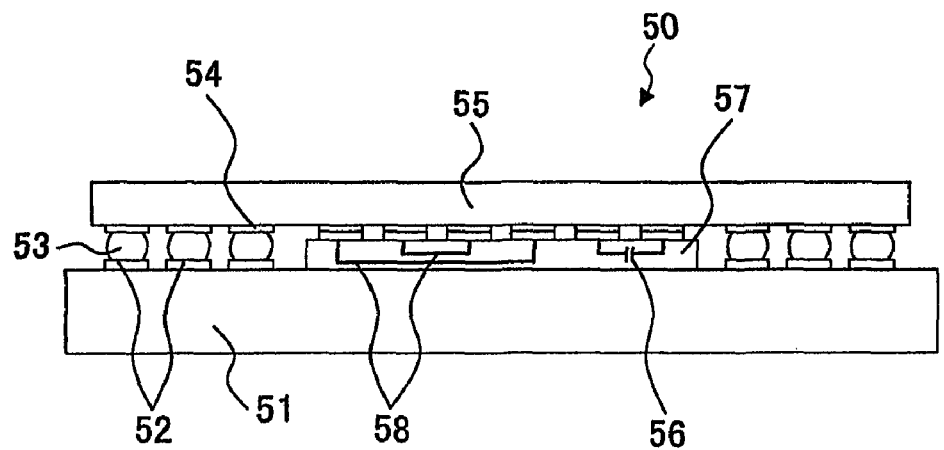
FIG. 2 is a cross-sectional view showing the composition of a conventional built-in part type semiconductor device.
Figure 3:
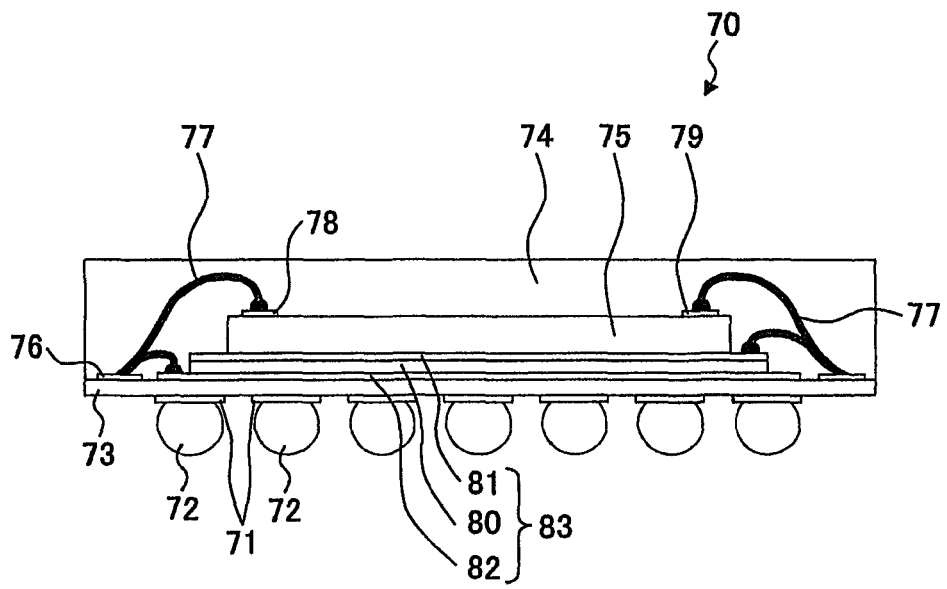
FIG. 3 is a cross-sectional view showing the composition of a conventional BGA package type semiconductor device.
Figure 4:
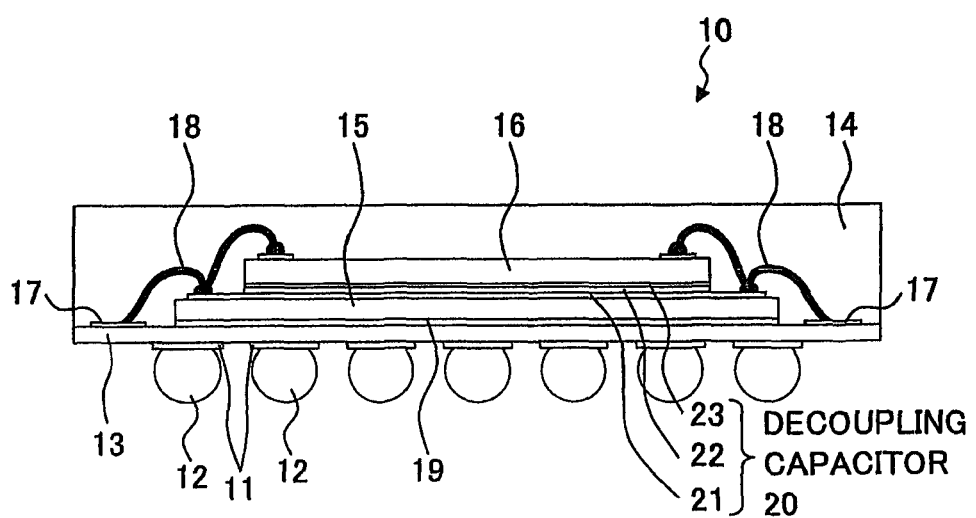
FIG. 4 is a cross-sectional view showing the composition of a semiconductor device in a first embodiment of the invention.
Figure 5:
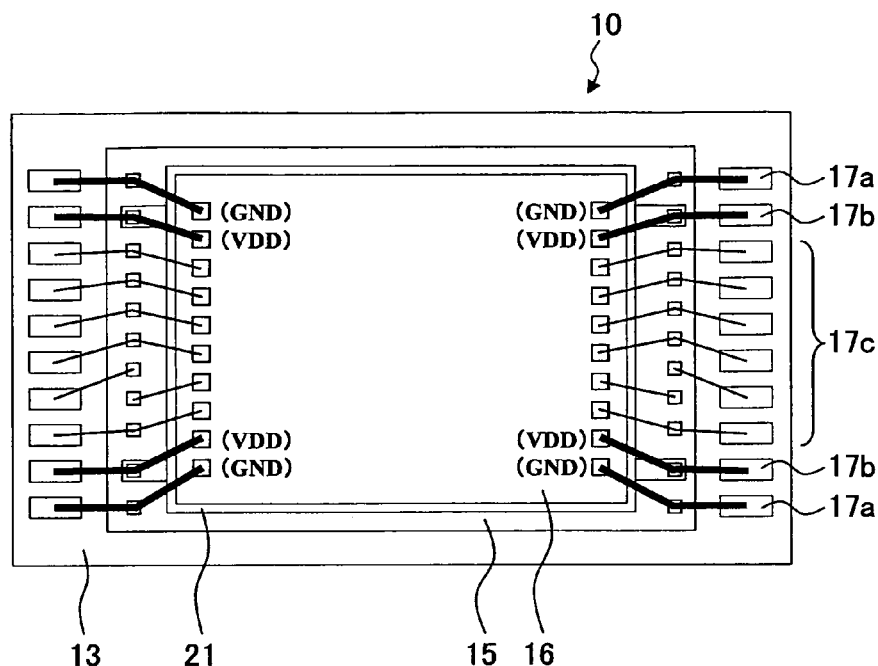
FIG. 5 is a top view showing the composition of the semiconductor device in the first embodiment of the invention.

FIG. 4 and FIG. 5 show the composition of a semiconductor device with a built-in capacitor (capacitive element) in a first embodiment of the invention. In this embodiment, the laminated type semiconductor device having two semiconductor chips is assumed.

As shown in FIG. 4 and FIG. 5, the semiconductor device 10 comprises a supporting substrate 13 wherein solder balls 12 are bonded to pads 11 that are arranged in an array formation on the back surface of the supporting substrate 13, and a first semiconductor chip 15 and a second semiconductor chip 16 which are disposed over the supporting substrate 13 and covered or sealed with an encapsulation resin 14.

The supporting substrate 13 is provided so that wiring layers are disposed on the surface and/or within the inside of an insulating substrate, such as glass epoxy. The back/front surface wiring layer and the internal wiring layer are interconnected by interlayer-connection conductors, if needed.

A plurality of bonding pads 17, including ground pads 17a, power-supply pads 17b, and signal pads 17c, are disposed on the surface of the supporting substrate 13. These pads 17a, 17b and 17c are respectively connected to ground electrode pads, power-supply electrode pads, and signal electrode pads on the first semiconductor chip 15 and on the second semiconductor chip 16 by wires 18.

In the above-described semiconductor device 10, the first semiconductor chip 15 in the face-up state (the state in which the circuit formation surface of the chip faces upward) is bonded to the supporting substrate 13 using a first adhesive 19.

The first adhesive 19 may be made of a silicone resin or an epoxy resin, for example. It is preferred that an adhesive tape is used as the first adhesive 19, in order to prevent unnecessary outflow of adhesive to the circumference of the semiconductor chip 15. A paste-like adhesive may be used instead, if the unnecessary outflow does not occur.

The conductor layer 21 is formed beforehand on the circuit-formation surface of the first semiconductor chip 15 through the reflow wiring process, and it is connected to the power supply electrode of the first semiconductor chip 15 concerned. As the material of the conductor layer 21, a metallic material, such as copper (Cu) or aluminum (Al), may be used.

The second semiconductor chip 16 in the face-up state is bonded to the first semiconductor chip 15 using a second adhesive 22.

On the other hand, the conductor layer 23 is formed beforehand on the back surface of the second semiconductor chip 16 through sputtering or the like. The conductor layer 23 is made of a metallic material, such as copper or aluminum, for example. The conductor layer 23 is connected to the ground electrode which defines the potential of the bulk portion of the second semiconductor chip 16.

In this embodiment, the conductor layer 21 disposed on the first semiconductor chip 15 and the conductor layer 23 disposed on the back surface of the second semiconductor chip 16 are arranged via the second adhesive 22 having an area almost equivalent to the area of the second semiconductor chip 16, so that the conductor layer 21 and the conductor layer 23 confront each other. In this composition, the second adhesive 22 is used as a dielectric material while the conductor layers 21 and 23 are used as the two mutually opposed electrodes, so that a decoupling capacitor (capacitive element) 20 is formed and arranged.

As a material of the second adhesive 22, for example, a silicone resin or an epoxy resin may be used. The second adhesive 22 serves as a dielectric material which determines the capacitance of the capacitor 20. Therefore, it is preferred that its specific inductive capacity is high and its thickness is as small as possible. In this embodiment, it is desirable that the second adhesive 22 has a specific inductive capacity of 5 or larger and a thickness of 20 micrometers or less.

Moreover, since it is necessary that the second adhesive 22 is applicable with a fixed possible area and thickness, a tape-like adhesive or a sheet-like adhesive is used. If the formation of adhesive with a fixed area and thickness is possible, a paste-like adhesive may also be used.

Figure 6:
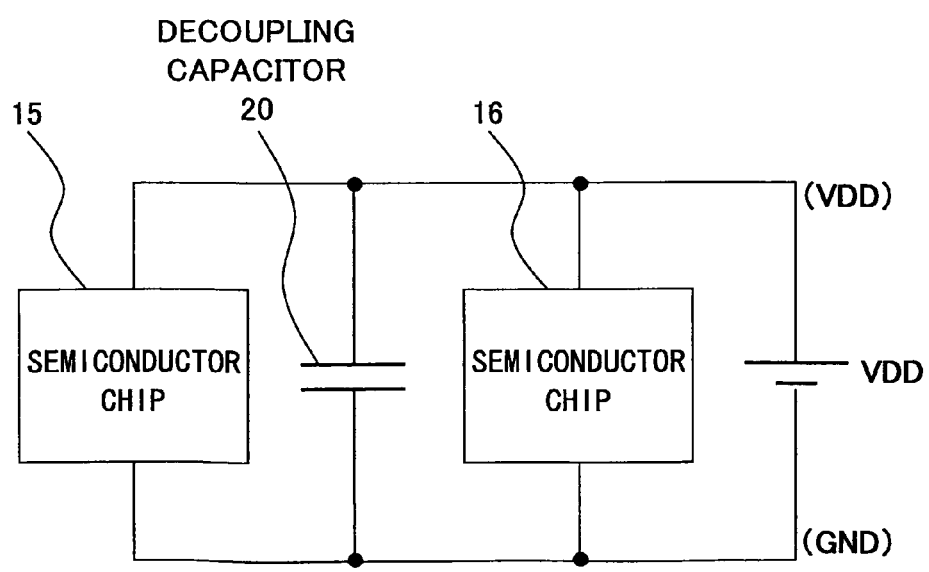
FIG. 6 is a circuit diagram showing an equivalent circuit in the semiconductor device shown in FIG. 4.

As shown in the equivalent circuit of FIG. 6, the capacitor 20 is inserted and disposed between a power-supply electrode (VDD) and a ground electrode (GND), and the capacitor 20 functions as a decoupling capacitor.

Thus, in the semiconductor device 10 of this embodiment, the capacitor 20 is formed and disposed between the semiconductor chip 15 and the semiconductor chip 16 which are arranged in the laminated state, and the arrangement of electrodes of a capacitor on the supporting substrate 13 is made unnecessary.

Accordingly, it is possible to expand the space for arranging the wiring on the supporting substrate 13 without changing the size of the supporting substrate 13, and this enables the formation of a small-size, thin semiconductor device with a built-in capacitor.

Figure 7:
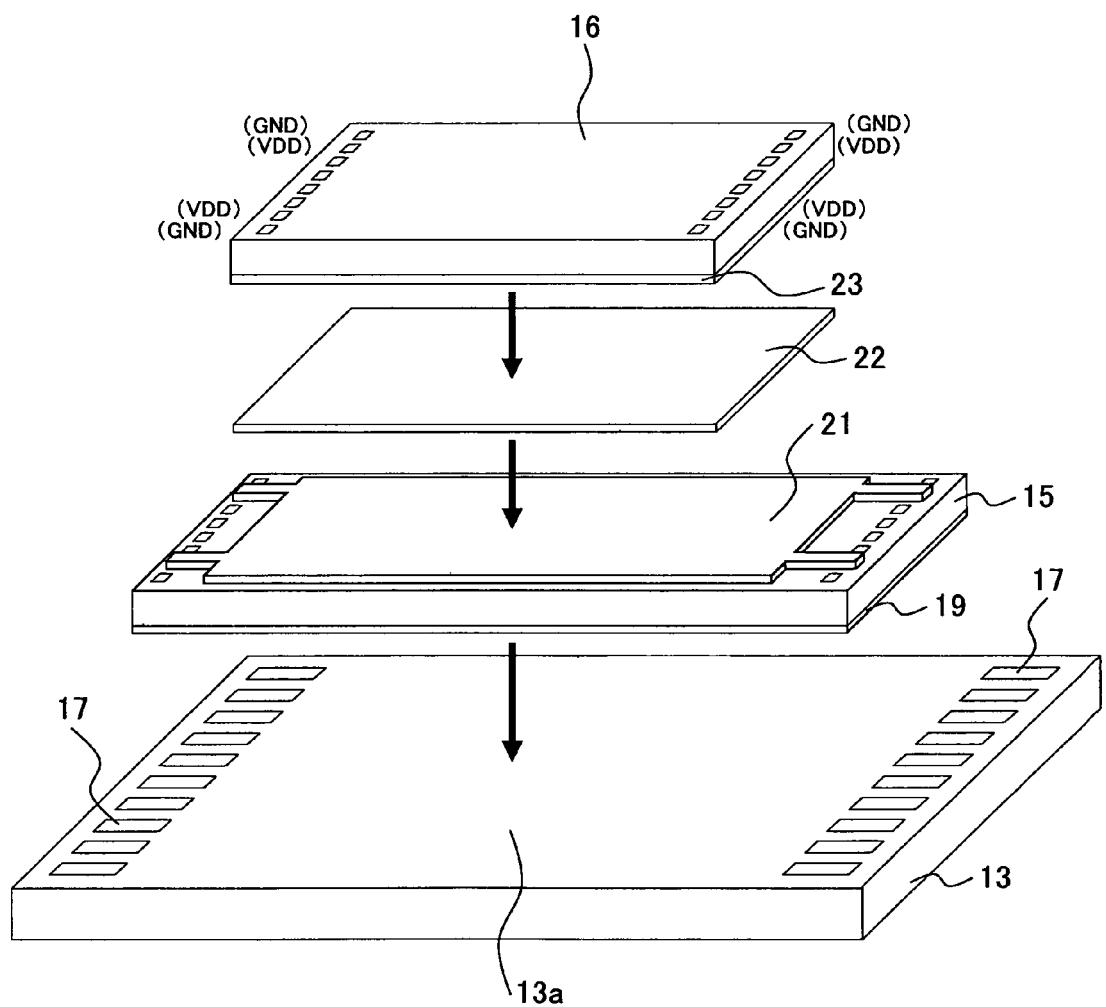
FIG. 7 is an exploded perspective view showing the composition of the semiconductor device in the first embodiment of the invention.

FIG. 7 is an exploded perspective view showing the composition of the semiconductor device 10 in the first embodiment of the invention.

As shown in FIG. 7, in this embodiment, the conductor layer 21 is disposed on the surface of the first semiconductor chip 15, and the first semiconductor chip 15 is bonded to and disposed over the front surface 13a of the supporting substrate 13 via the first adhesive layer 19. And the second adhesive 22 is bonded to the conductor layer 21, and the second semiconductor chip 16 in which the second conductor layer 23 is disposed over the back surface of the second semiconductor chip 16, is bonded to and disposed over the conductor layer 21 via the second adhesive 22.

In the illustration of FIG. 7, illustration of the wires and the encapsulation resin is omitted, for the sake of convenience of description.

According to this composition, arrangement of the electrodes for capacitors on the front surface 13a of the supporting substrate 13 is not needed, but a sufficient space for arranging the wiring can be secured on the supporting substrate 13.

In the composition of FIG. 7, the area of the conductor layer 23 is equivalent to the area of the second semiconductor chip 15. However, depending on the relation of the wire connection with other semiconductor chips, the configuration and area of the conductor layer 23 may be changed.

In a case where a plurality of kinds of power supply are provided, the conductor layer 23 may be divided into portions, if needed, and a plurality of decoupling capacitors for the plurality of kinds of power supply may be formed with each of the divided portions respectively. Some of the capacitors formed with the divided conductor layer portions may be used for the formation of a different circuit than a decoupling capacitor.

Figure 8:
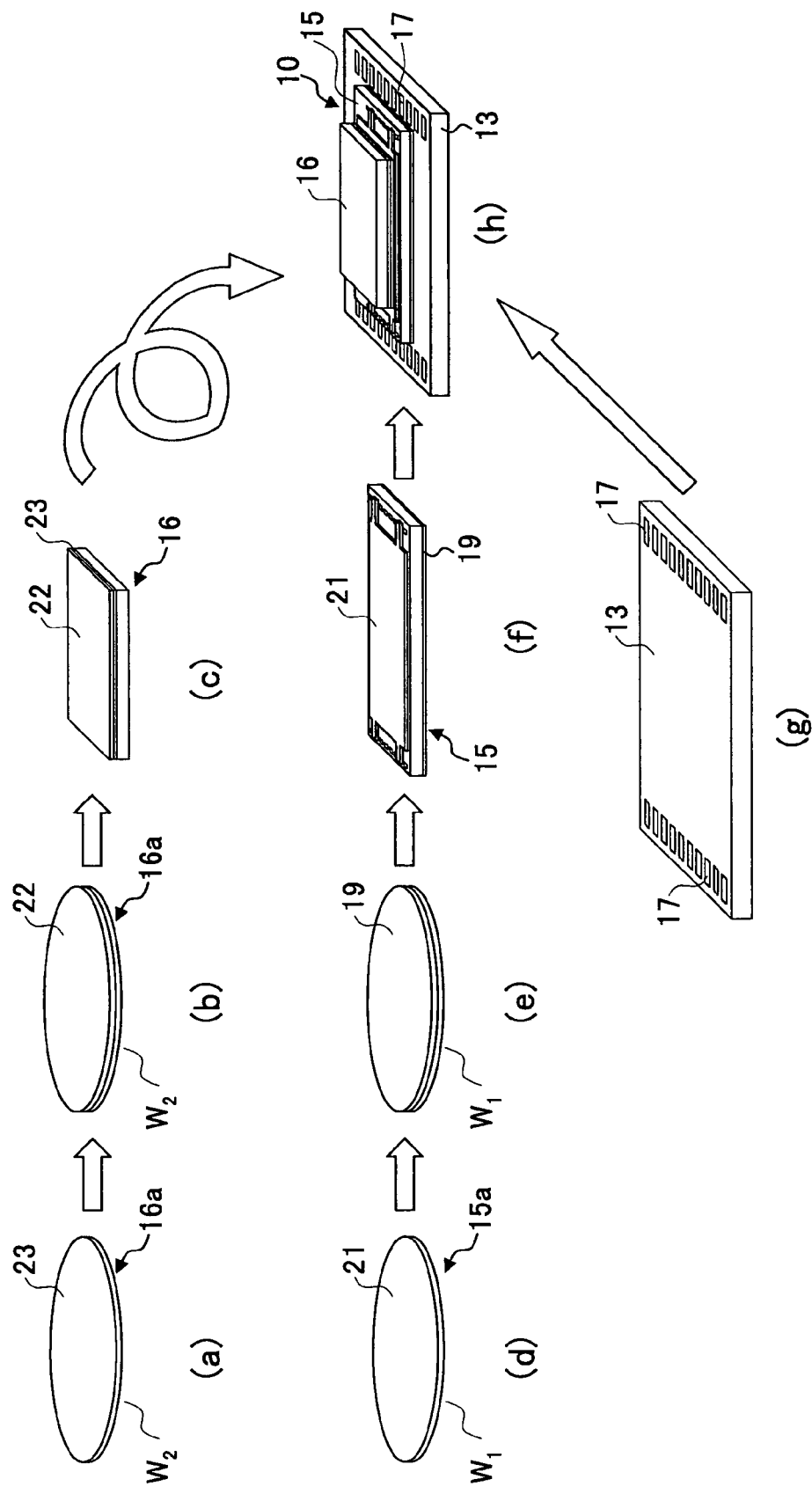
FIG. 8 is a diagram for explaining a method of manufacturing the semiconductor device shown in FIG. 7.

FIG. 8 is a diagram for explaining a method of manufacturing the semiconductor device shown in FIG. 4, FIG. 5 and FIG. 7.

As shown in FIG. 8 (a), the sputtering process is performed on the back surface of a semiconductor substrate (wafer) W2 containing a plurality of second semiconductor chips 16a, so that the conductor layer 23 is formed thereon.

Next, as shown in FIG. 8 (b), the tape-like or sheet-like second adhesive 22, which is used as the dielectric material of the capacitor 20 as well as used for adhesion with the first semiconductor chip 15, is applied to the conductor layer 23.

Then, as shown in FIG. 8 (c), the dicing process of the semiconductor substrate W2 is performed in order to cut the wafer into pieces, so that the second semiconductor chip 16 is formed as one of the pieces.

On the other hand, as shown in FIG. 8 (d), the reflow wiring process is performed on the circuit-formation surface of a semiconductor substrate (wafer) W1 containing a plurality of first semiconductor chips 15a, and the conductor layer 21 is formed on the semiconductor substrate W1.

Next, as shown in FIG. 8 (e), the tape-like or sheet-like first adhesive 19, which is used for adhesion with the supporting substrate 13, is applied to the back surface of the semiconductor substrate W1.

Then, as shown in FIG. 8 (f), the dicing process of the semiconductor substrate W1 is performed in order to cut the wafer into pieces, so that the first semiconductor chip 15 is formed as one of the pieces.

Meanwhile, as shown in FIG. 8 (g), the supporting substrate 13 is prepared. In the supporting substrate 13, the wiring layers are disposed on the surface and/or within the inside of an insulating substrate, such as glass epoxy, and the back/front surface wiring layer and the internal wiring layer are interconnected by the interlayer-connection conductors, if needed. The plurality of bonding pads 17 (including power-supply pads, ground pads, and signal pads) are selectively disposed on the wiring layers of the supporting substrate 13 in this embodiment.

Although a single-piece supporting substrate 13 is illustrated in this embodiment, a sheet-like supporting substrate which collectively contains a plurality of supporting substrates 13 arranged in an array formation may be prepared alternatively.

Subsequently, as shown in FIG. 8 (h), the first semiconductor chip 15 is bonded to the supporting substrate 13 via the first adhesive 19, and the second semiconductor chip 16 is bonded to the first semiconductor chip 15 via the second adhesive 22. In this stage, the capacitor 20 in which the dielectric layer which is made of the adhesive 22 is disposed between the upper and lower electrodes (the conductor layers 21 and 23) is formed. Thus, the semiconductor device 10 with the built-in capacitor is produced.

Subsequently, the resin molding process is performed on this semiconductor-chip lamination structure, so that the first and second semiconductor chips 15 and 16 are covered or sealed with the encapsulation resin 14.

In a case in which the sheet-like supporting substrate 13 as mentioned above is used, the resin molding process is performed on the plurality of semiconductor-chip lamination structures arranged in an array formation and on the supporting substrate 13 collectively, and then the cutting of the resin 14 and the supporting substrate 13 containing the plurality of semiconductor-chip lamination structures is performed, so that a plurality of semiconductor devices each containing a semiconductor-chip lamination structure are formed individually.

In this embodiment, the manufacturing method which is expected to be the most efficient has been illustrated. If the formation of the conductor layers 21 and 23 and the dielectric material 22 which are the component parts of a capacitor can be performed, it is also possible to use other manufacturing methods.

Next, the composition of a semiconductor device with a built-in capacitor in a second embodiment of the invention will be explained with reference to FIG. 9 through FIG. 11. In this embodiment, the laminated type semiconductor device including two semiconductor chips is assumed.

Figure 9:
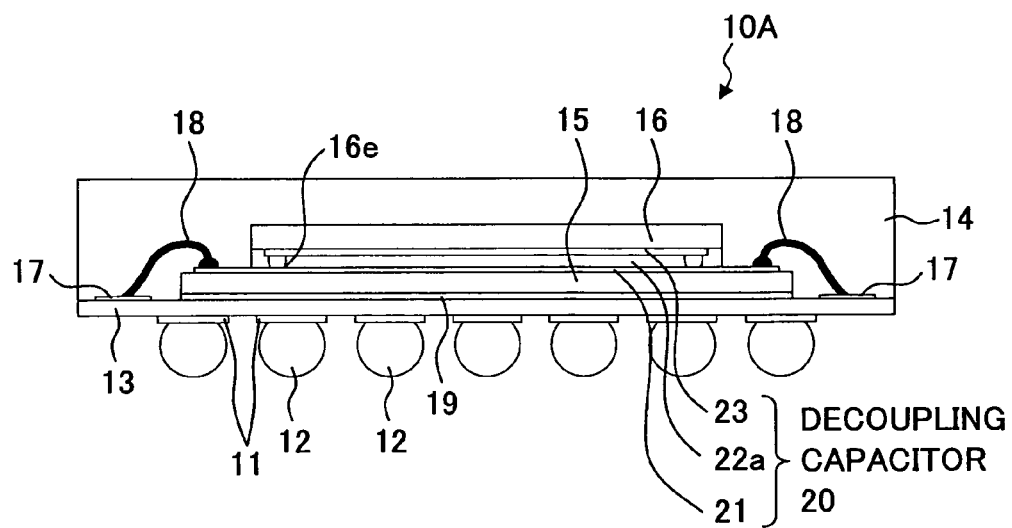
FIG. 9 is a cross-sectional view showing the composition of a semiconductor device in a second embodiment of the invention.
Figure 10:
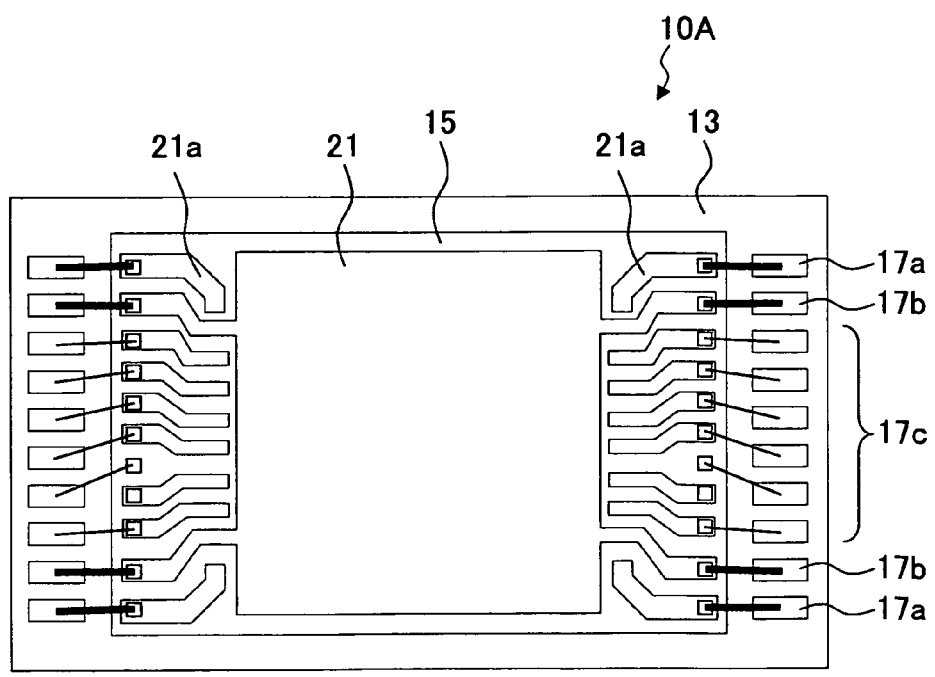
FIG. 10 is a top view showing the composition of the semiconductor device in the second embodiment of the invention.
Figure 11:
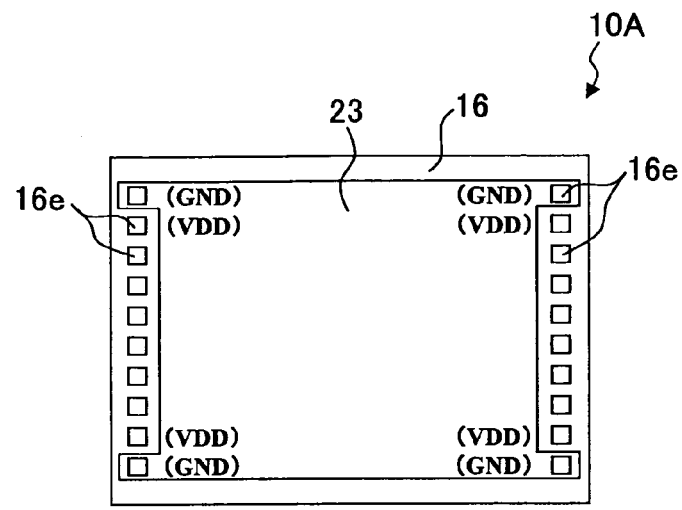
FIG. 11 is a plan view showing the back surface of the second semiconductor chip in the semiconductor device shown in FIG. 9.

FIG. 10 shows the state of the composition of the semiconductor device shown in FIG. 9 in which the encapsulation resin 14 and the second semiconductor chip 16 are not provided. FIG. 11 shows the pattern of the electrode layer on the back surface of the second semiconductor chip 16 (i.e., the surface of the second semiconductor chip 16 which confronts the first semiconductor chip 15).

As shown in FIG. 9, the semiconductor device 10A of this embodiment comprises the supporting substrate 13 wherein the solder balls 12 are bonded to the pads 11 which are arranged in an array formation on the back surface of the supporting substrate 13, and the first semiconductor chip 15 and the second semiconductor chip 16 which are disposed over the supporting substrate 13 and covered or sealed with the encapsulation resin 14.

The supporting substrate 13 is provided so that the wiring layers are disposed on the surface and/or within the inside of an insulating substrate, such as glass epoxy. The back/front surface wiring layer and the internal wiring layer are interconnected by the interlayer-connection conductors, if needed.

The ground pads 17a, the power-supply pads 17b, and the signal pads 17c of the plurality of bonding pads 17, disposed on the surface of the supporting substrate 13, are respectively connected to the ground electrode pads, the power-supply electrode pads, and the signal electrode pads on the first semiconductor chip 15 and on the second semiconductor chip 16 by the wires 18.

In the above-mentioned semiconductor device 10A, the first semiconductor chip 15 in the face-up state (the state in which the circuit-formation surface faces upward) is bonded to the supporting substrate 13 using the first adhesive 19.

A silicone resin or an epoxy resin may be used as the material of the first adhesive 19 similar to the previous embodiment. It is preferred that a tape-like adhesive or a sheet-like adhesive is used as the material of the first adhesive 19, in order to prevent the unnecessary outflow of adhesive from the semiconductor chip.

On the other hand, the conductor layer 21 is formed on the circuit-formation surface of the first semiconductor chip 15 through the reflow wiring process, and the conductor layer 21 is connected to the power supply electrodes of the first semiconductor chip 15. As the material of the conductor layer 21, a metallic material, such as copper (Cu) or aluminum (Al) can be used, for example.

At this time, in addition to the formation of the conductor layer 21, the ground electrodes and the signal electrodes for connection with the second semiconductor chip 16 are also formed on the circuit-formation surface of the first semiconductor chip 15 through the reflow wiring process.

In the above-mentioned second embodiment, the second semiconductor chip 16 in the face-down state (the state in which the circuit-formation surface faces downward) is bonded to the first semiconductor chip 15 using a resin which forms the underfill material 22a.

Since the underfill material 22a must be applied with a fixed area and thickness, a tape-like material or a sheet-like material is used as the underfill material 22a. If formation of the underfill material 22a with a fixed area and thickness is possible, a paste-like material may be used.

The conductor layer 23 is formed on the circuit-formation surface of the second semiconductor chip 16 through the reflow wiring process, and the conductor layer 23 is connected to the ground electrodes of the second semiconductor chip 16. The projecting electrodes 16e of the second semiconductor chip 16 are connected to the reflow wiring layer 21a which is formed on the first semiconductor chip 15.

The power supply electrodes, the ground electrodes, and the other signal pins on the first semiconductor chip 15 are connected to the bonding pads 17 on the supporting substrate 13 by the wires 18.

Namely, in this embodiment, the conductor layer 21 disposed on the first semiconductor chip 15, and the conductor layer 23 disposed on the front surface (circuit-formation surface) of the second semiconductor chip 16 confront each other via the underfill material 22a having an area that is almost equivalent to the area of the second semiconductor chip 16, and they are bonded together, so that the capacitor (capacitive element) 20 which uses the conductor layers 21 and 23 as the upper and lower electrodes and uses the underfill material 22a as the dielectric material between the upper and lower electrodes is formed.

Since the underfill material 22a functions as the dielectric material which determines the capacitance of the capacitor 20, it is preferred that the underfill material 22a has a specific inductive capacity as high as possible and has a thickness as small as possible.

Next, the composition of the semiconductor device in the third embodiment of the invention will be explained with reference to FIG. 12 through FIG. 14.

Figure 12:
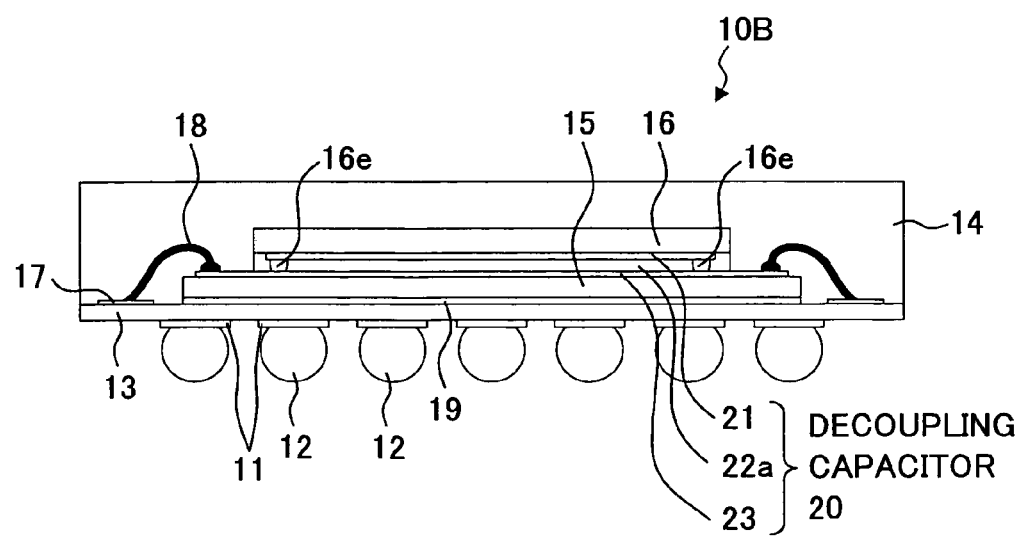
FIG. 12 is a cross-sectional view showing the composition of a semiconductor device in a third embodiment of the invention.
Figure 13:
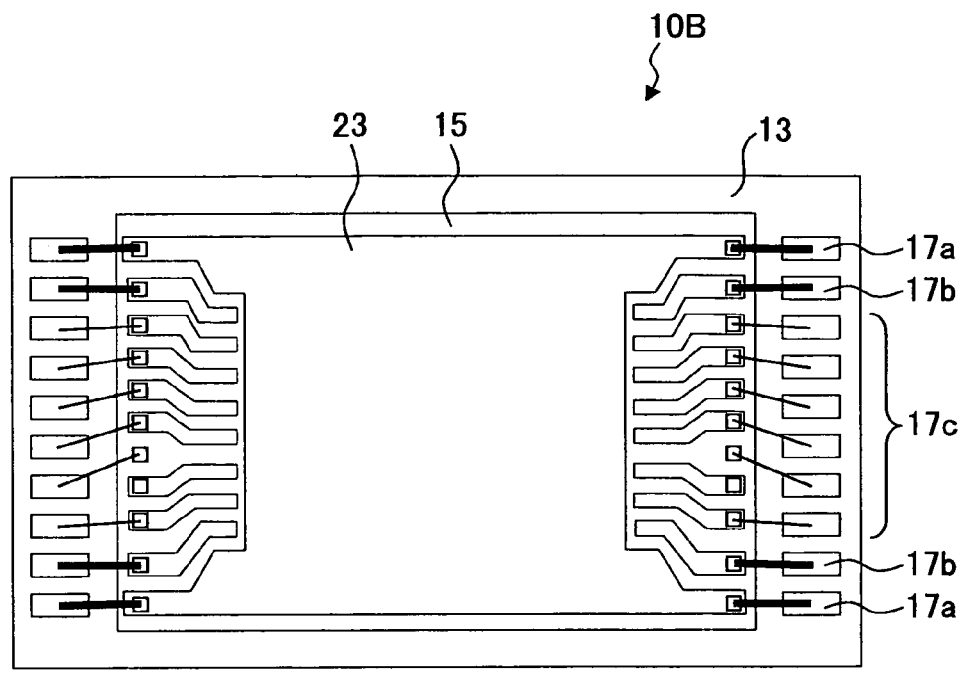
FIG. 13 is a top view showing the composition of the semiconductor device in the third embodiment of the invention.
Figure 14:
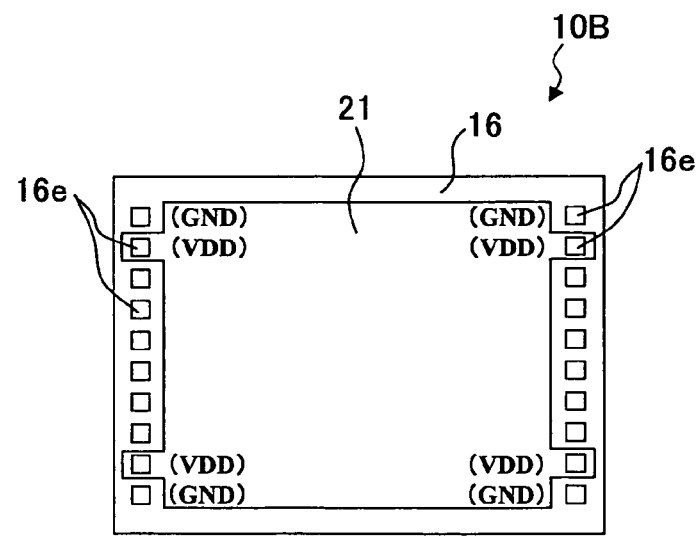
FIG. 14 is a plan view showing the back surface of the second semiconductor chip in the semiconductor device shown in FIG. 12.

FIG. 13 shows the state of the composition of the semiconductor device shown in FIG. 12 in which the encapsulation resin 14 and the second semiconductor chip 16 are not provided. FIG. 14 shows the pattern of the electrode layer on the back surface of the second semiconductor chip 16 (i.e., the surface of the second semiconductor chip 16 which confronts the first semiconductor chip 15).

As shown in FIG. 12, the semiconductor device 10B of this embodiment is essentially the same as the semiconductor device of the previously described second embodiment except the following points. Namely, in this embodiment, the conductor layer 23 connected to the ground electrodes 17a on the supporting substrate 13 is disposed on the circuit-formation surface of the first semiconductor chip 15, and the conductor layer 21 connected to the power-supply electrodes 17b on the supporting substrate 13 is disposed on the circuit-formation surface of the second semiconductor chip 16.

Other elements in this embodiment are essentially the same as corresponding elements in the previously described second embodiment which are designated by the same reference numerals, and a description thereof is omitted.

Next, the radiation noise which may be produced during operation of the semiconductor device 10A of the second embodiment shown in FIG. 9 will be explained with reference to FIG. 15.

Figure 15:
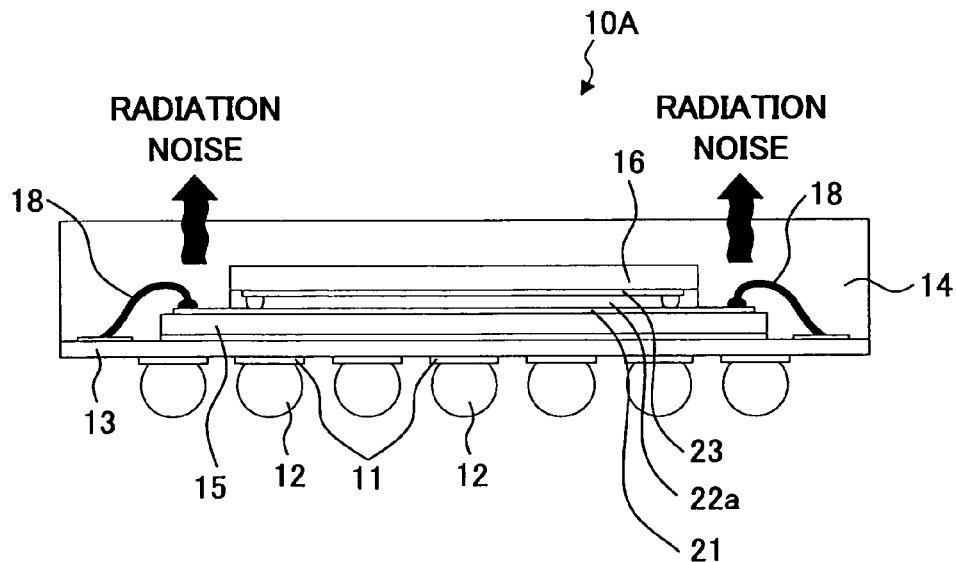
FIG. 15 is a diagram for explaining the radiation noise produced when the semiconductor device of FIG. 9 is operated.

As shown in FIG. 15, in the semiconductor device 10A of the second embodiment, the ground conductor layer 23 is formed on the second semiconductor chip 16. Since the area of the conductor layer 23 is equivalent to or less than the area of the second semiconductor chip 16, there may be a case in which the effect of preventing the radiation of noise produced from the first semiconductor chip 15 is not enough.

On the other hand, suppose that the semiconductor device 10B of the third embodiment shown in FIG. 12 is mounted on a mother board and it is operated. See FIG. 16.

Figure 16:
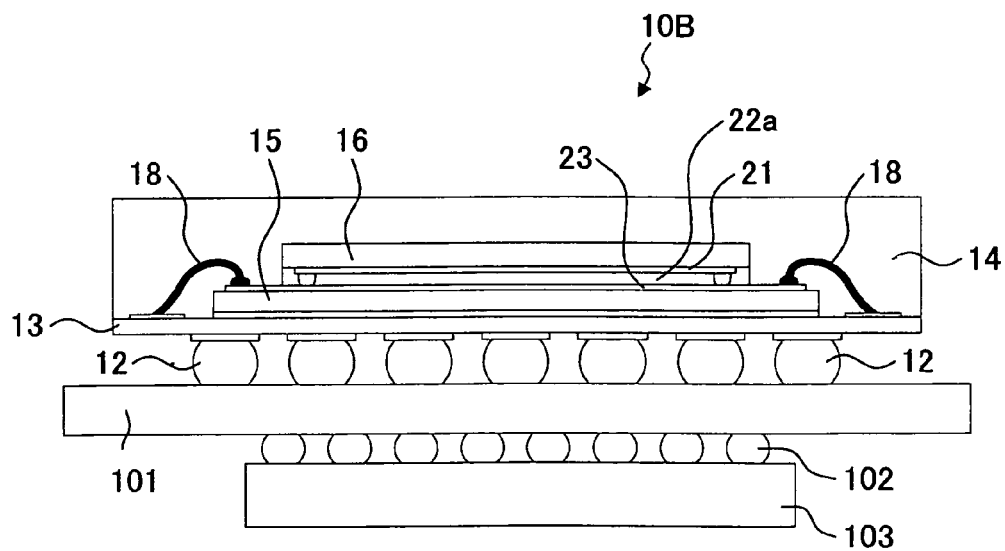
FIG. 16 is a diagram for explaining the effect when the semiconductor device of FIG. 12 mounted on the mother board is operated.

As shown in FIG. 16, the ground conductor layer 23 is formed on the first semiconductor chip 15, and the area of the conductor layer 23 is larger than the area of the second semiconductor chip 16. It is possible for the third embodiment to effectively prevent the radiation of noise produced from the second semiconductor chip 16.

Moreover, as shown in FIG. 16, it is possible for the third embodiment to prevent the influence of noise produced from the second semiconductor chip 16 on another electronic part 103 mounted on the back surface of the mother board 101 via solder balls 102.

In the first through third embodiments mentioned above, the semiconductor device having two semiconductor chips (the first and second semiconductor chips) laminated is assumed. In the following embodiments (including the fourth to ninth embodiments), the semiconductor device having only a single, active semiconductor chip (i.e., a semiconductor chip on which electronic circuits, such as logical circuits, are formed) in which the capacitor (capacitive element) according to the invention is incorporated will be explained.

The composition of the semiconductor device with a built-in capacitor in the fourth embodiment of the invention will be explained with reference to FIG. 17 and FIG. 18.

Figure 17:
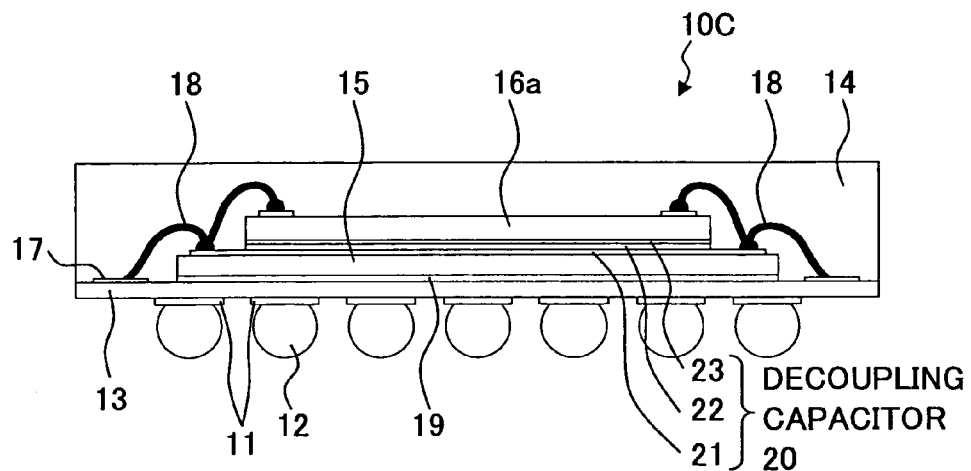
FIG. 17 is a cross-sectional view showing the composition of a semiconductor device in a fourth embodiment of the invention.
Figure 18:
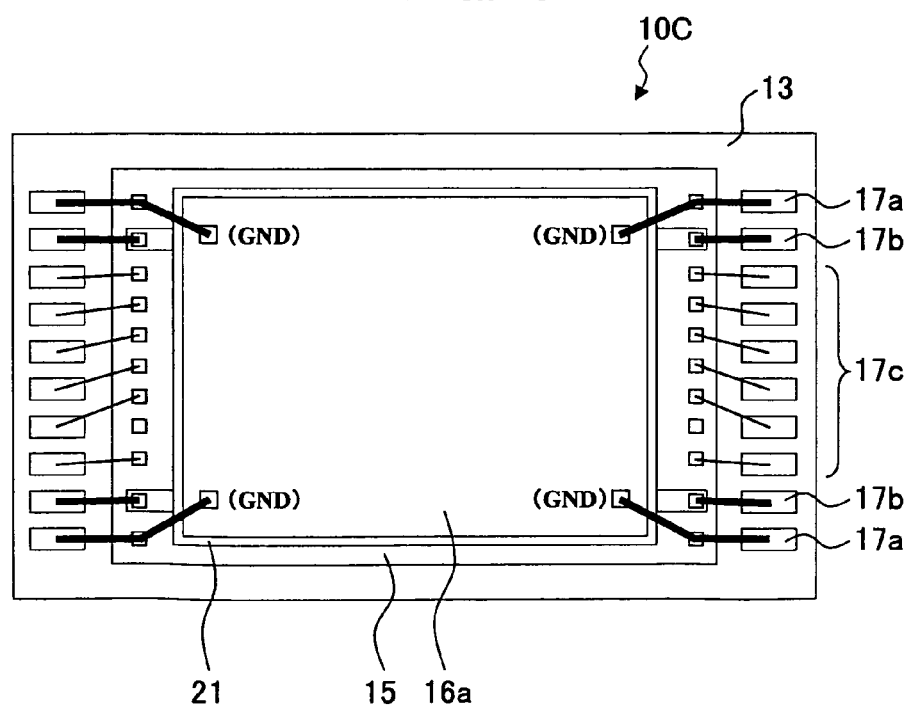
FIG. 18 is a top view showing the composition of the semiconductor device in the fourth embodiment of the invention.

FIG. 18 shows the state of the composition of the semiconductor device shown in FIG. 17 in which the encapsulation resin 14 is not provided.

As shown in FIG. 17, in the semiconductor device 10C of this embodiment, in order to form a capacitor (capacitive element) together with a semiconductor chip 15, a dummy chip 16a is mounted over the semiconductor chip 15 concerned.

Other composition of this embodiment is essentially the same as that of the first embodiment mentioned above, and a description thereof will be omitted.

In the semiconductor device 10C of this embodiment, the dummy chip 16a is made of, for example, a silicon (Si) chip. In order to allow the dummy chip 16a to serve as a conductor layer, the sputtering process is performed beforehand on both the back and front surfaces of the dummy chip 16a with aluminum or the like, to form metal layers thereon. Alternatively, the surfaces of the silicon dummy chip 16a may be doped beforehand so as to set impurities at high concentration, so that the conductivity of the dummy chip 16a is brought close to a conductor.

By using the dummy chip having the back and front surfaces covered with the metal layers, performance of the wire bonding at any position on the dummy chip concerned is possible.

In the semiconductor device 10C of this embodiment, the use of the dummy chip 16a enables the flexibility of interconnections of the power supply wiring or the ground wiring to increase. And, if only the positional relationship between the semiconductor chip 15 and the bonding pads 17 of the supporting substrate 13 is taken into consideration, the semiconductor device 10C will be designed, and the flexibility of design, can be raised.

The composition of the semiconductor device with a built-in capacitor in the fifth embodiment of the invention will be explained with reference to FIG. 19 and FIG. 20.

Figure 19:
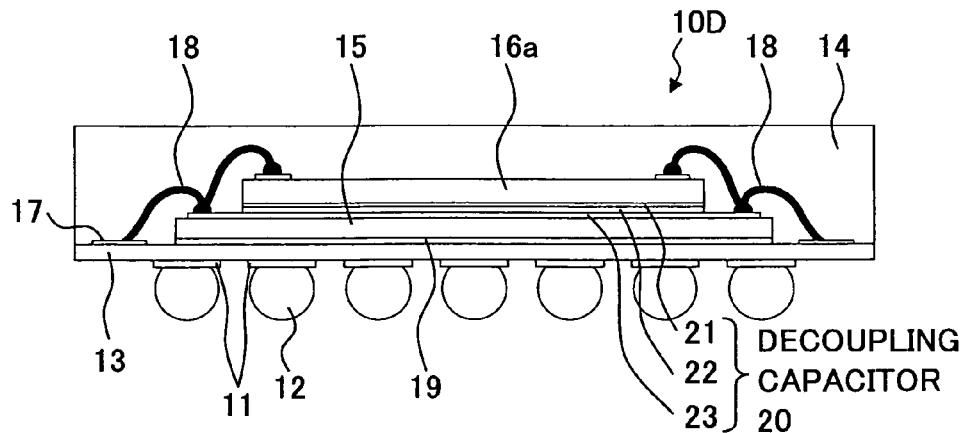
FIG. 19 is a cross-sectional view showing the composition of a semiconductor device in a fifth embodiment of the invention.
Figure 20:
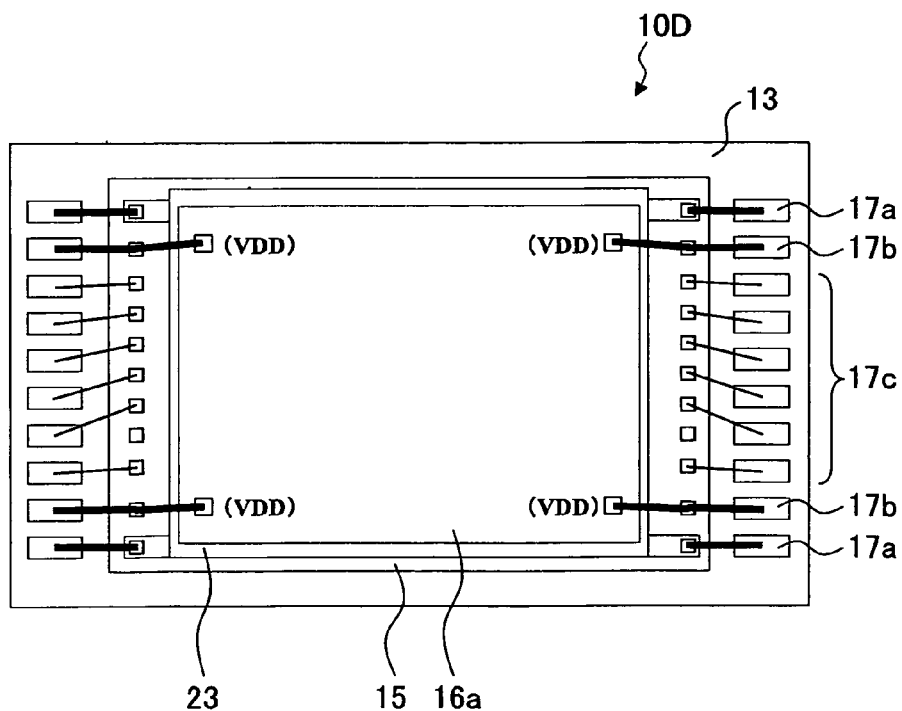
FIG. 20 is a top view showing the composition of the semiconductor device in the fifth embodiment of the invention.

FIG. 20 shows the state of the composition of the semiconductor device shown in FIG. 19 in which the encapsulation resin 14 is not provided.

The composition of the semiconductor device 10D of this embodiment is essentially the same as the composition of the fourth embodiment except the following point. Namely, the potential of the dummy chip 16a is set to be equal to the potential of the power supply potential VDD, and the conductor layer 23 connected to the ground electrodes 17a is disposed on the circuit-formation surface of the semiconductor chip 15.

Other composition of this embodiment is essentially the same as that of the fourth embodiment, and a description thereof will be omitted.

In the case of the semiconductor device 10D of this embodiment, the conductor layer 23 connected to the ground electrodes 17a is formed on the semiconductor chip 15 (the lower semiconductor chip), and the area of the conductor layer 23 is larger than the area of the dummy chip 16a (the upper semiconductor chip). Therefore, when compared with the composition of the fourth embodiment, spreading of the radiation noise produced from the semiconductor chip 15 can be controlled more effectively.

Moreover, when the semiconductor device 10D is mounted on the mother board, the influence to other electronic parts carried on the back surface of the mother board can be inhibited effectively.

The composition of the semiconductor device with a built-in capacitor in the sixth embodiment of the invention will be explained with reference to FIG. 21 and FIG. 22.

Figure 21:
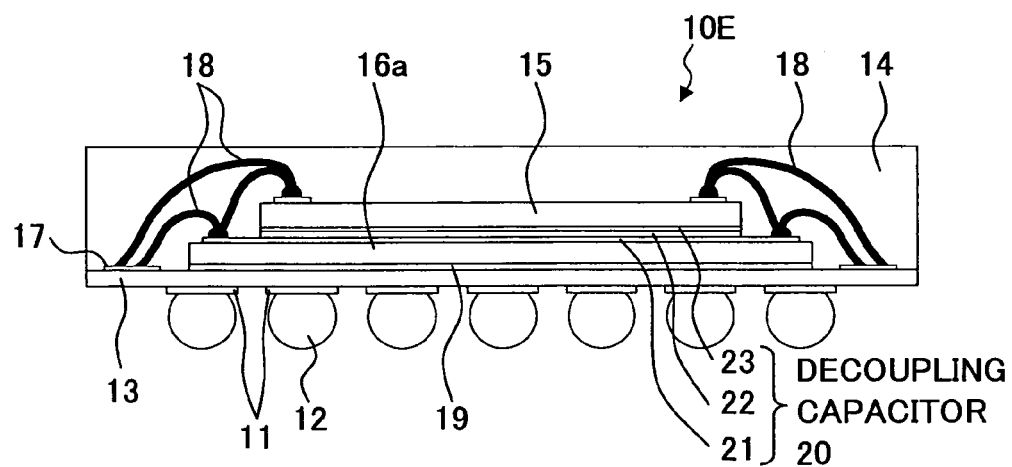
FIG. 21 is a cross-sectional view showing the composition of a semiconductor device in a sixth embodiment of the invention.
Figure 22:
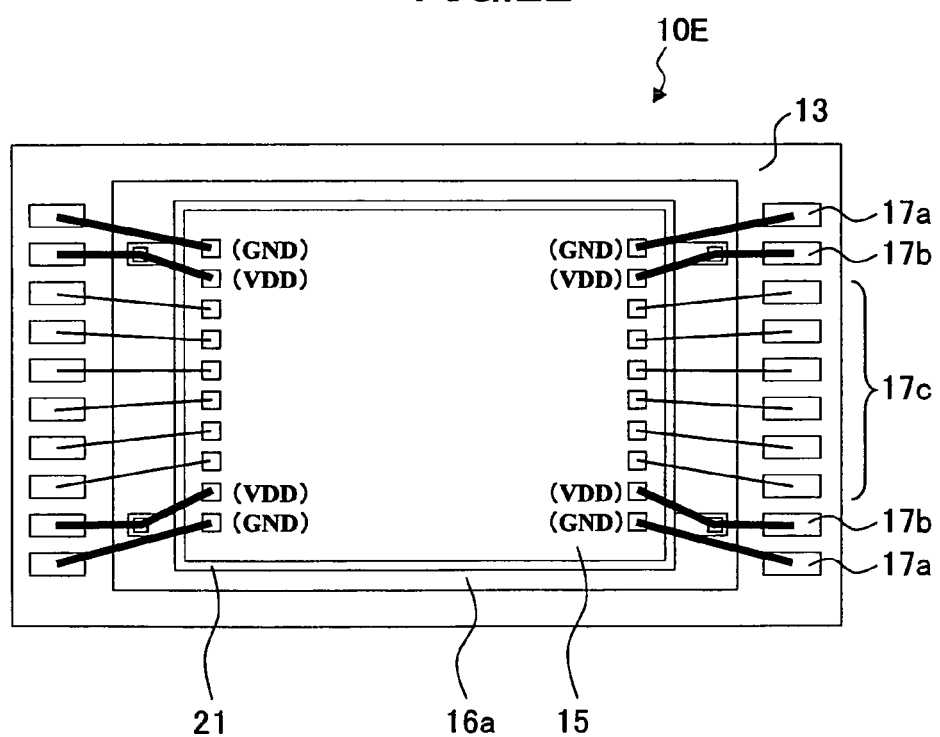
FIG. 22 is a top view showing the composition of the semiconductor device in the sixth embodiment of the invention.

FIG. 22 shows the state of the composition of the semiconductor device shown in FIG. 21 in which the encapsulation resin 14 is not provided.

As shown in FIG. 21, the semiconductor device 10E of this embodiment is provided so that the composition of the fourth embodiment is replaced by the composition wherein the semiconductor chip 15 is set in the upper position and the dummy chip 16a is set in the lower position.

Namely, in the semiconductor device 10E of FIG. 21, the dummy chip 16a in the lower position is mounted on the supporting substrate 13, and the semiconductor chip 15 in the upper position is bonded to the dummy chip 16a using the adhesive 22. Other composition of this embodiment is essentially the same as that of the fourth embodiment, and a description thereof will be omitted.

In the semiconductor device 10E of the sixth embodiment, when the size of the semiconductor chip 15 is remarkably smaller than the size of the whole semiconductor device (for example, in a case where the semiconductor chip 15 has too many electrodes and the number of outside solder balls connected to the electrodes also increases and the size of the supporting substrate 13 is enlarged), the dummy chip 16a having the size larger than the size of the semiconductor chip 15 is mounted in the lower position, and the curvature of the semiconductor device containing the supporting substrate 13 and the encapsulation resin 14 can be reduced.

The composition of the semiconductor device with a built-in capacitor in the seventh embodiment of the invention will be explained with reference to FIG. 23 and FIG. 24.

Figure 23:
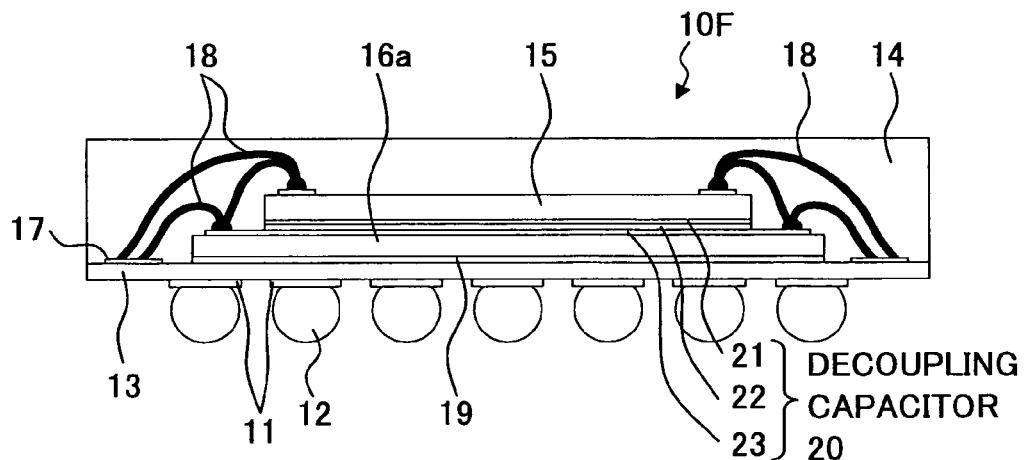
FIG. 23 is a cross-sectional view showing the composition of a semiconductor device in a seventh embodiment of the invention.
Figure 24:
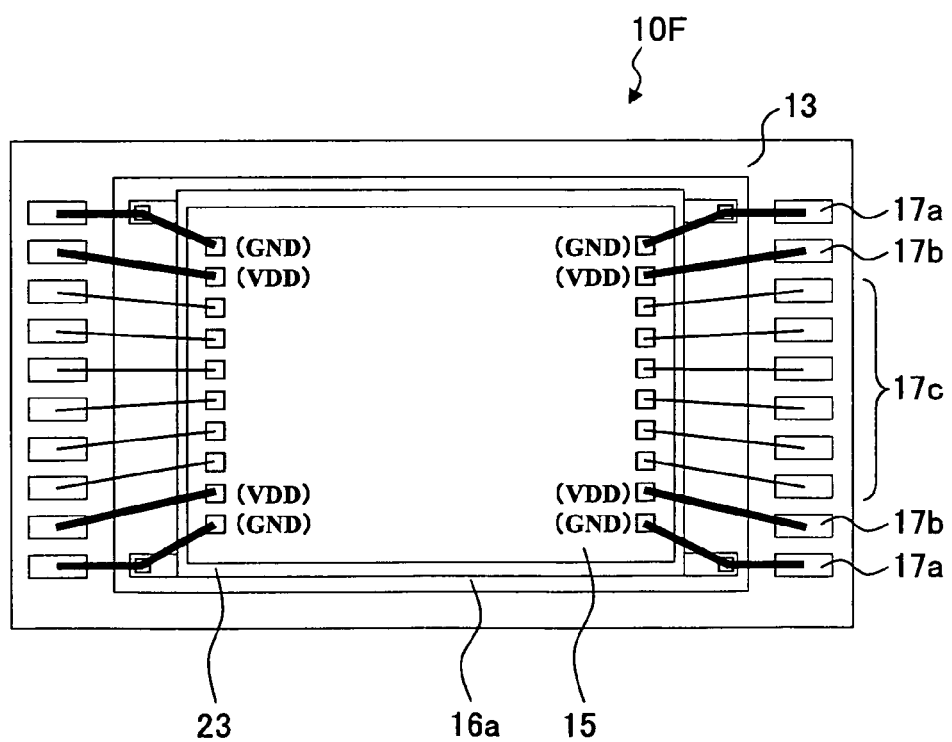
FIG. 24 is a top view showing the composition of the semiconductor device in the seventh embodiment of the invention.

FIG. 24 shows the state of the composition of the semiconductor device shown in FIG. 23 in which the encapsulation resin 14 is not provided.

As shown in FIG. 23, the semiconductor device 10F of this embodiment is provided so that the composition of the fifth embodiment is replaced by the composition wherein the semiconductor chip 15 is set in the upper position and the dummy chip 16a is set in the lower position.

Namely, in the semiconductor device 10F of FIG. 23, the dummy chip 16a in the lower position is mounted on the supporting substrate 11, and the semiconductor chip 15 in the upper position is bonded to the dummy chip 16a using the adhesive 22. Other composition of this embodiment is essentially the same as that of the fifth embodiment, and a description thereof will be omitted.

Similar to the sixth embodiment, in the semiconductor device 10F of the seventh embodiment, when the size of the semiconductor chip 15 is remarkably smaller than the size of the whole semiconductor device, the dummy chip 16a having a size larger than the size of the semiconductor chip 15 is mounted in the lower position. It is possible for the seventh embodiment to reduce the curvature of the whole semiconductor device containing the supporting substrate 13 and the encapsulation resin 22.

The composition of the semiconductor device with a built-in capacitor in the eighth embodiment of the invention will be explained with reference to FIG. 25 through FIG. 27.

Figure 25:
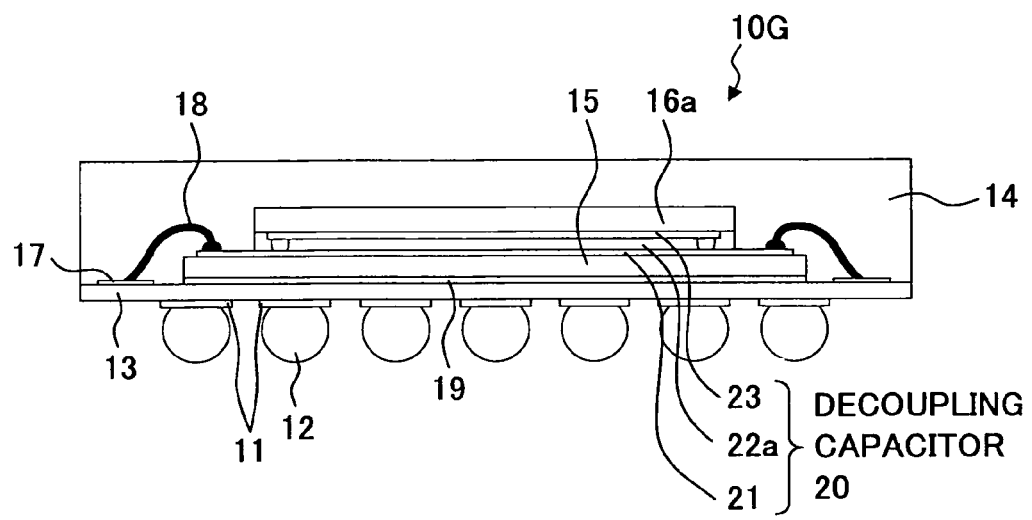
FIG. 25 is a cross-sectional view showing the composition of a semiconductor device in an eighth embodiment of the invention.
Figure 26:
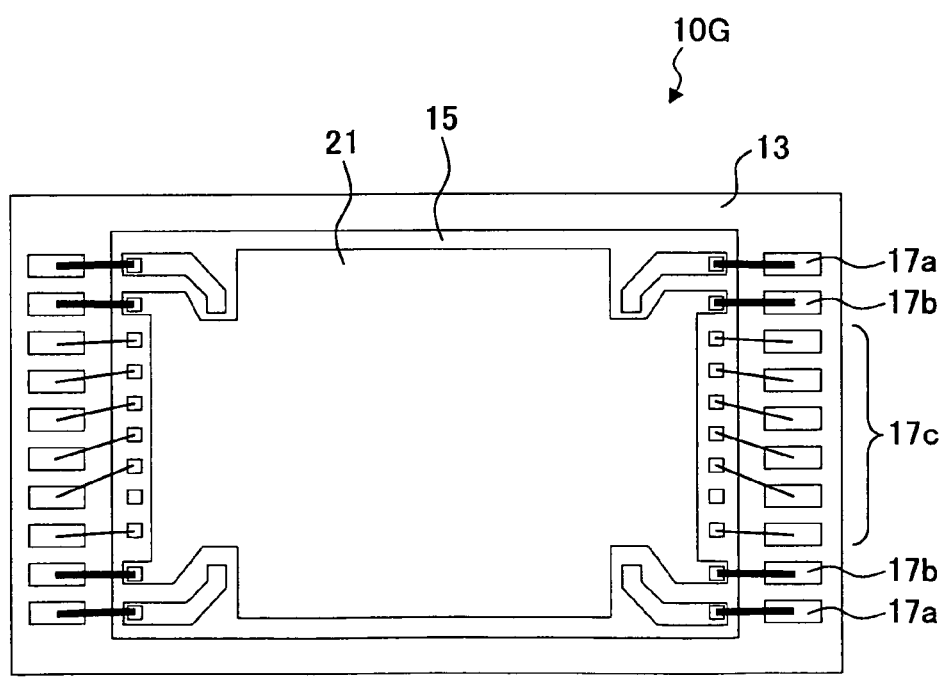
FIG. 26 is a top view showing the composition of the semiconductor device in the eighth embodiment of the invention.
Figure 27:
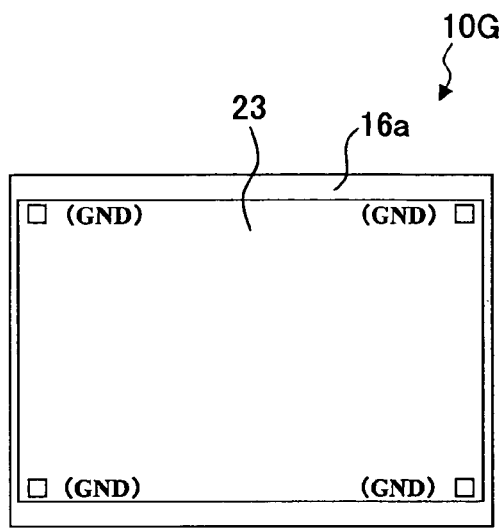
FIG. 27 is a plan view showing the back surface of the dummy chip in the semiconductor device shown in FIG. 25.

FIG. 26 shows the state of the composition of the semiconductor device shown in FIG. 25 in which the encapsulation resin 14 and the dummy chip 16a are not provided. FIG. 27 shows the composition of the back surface of the dummy chip 16a.

The semiconductor device 10G of this embodiment is provided so that the dummy chip 16a is mounted on the semiconductor chip 15 in the composition of the fourth embodiment. Other composition of this embodiment is essentially the same as that of the fourth embodiment, and a description thereof will be omitted.

In the semiconductor device 10G of the eighth embodiment, the wires 18 are not used for connection of the dummy chip 16a, and the height of the semiconductor device can be reduced by the amount corresponding to the height of the wire loop. Therefore, the structure of the semiconductor device 10G of this embodiment is suitable for the case in which a thinner semiconductor package is required.

The composition of the semiconductor device with a built-in capacitor in the ninth embodiment of the invention will be explained with reference to FIG. 28 through FIG. 30.

Figure 28:
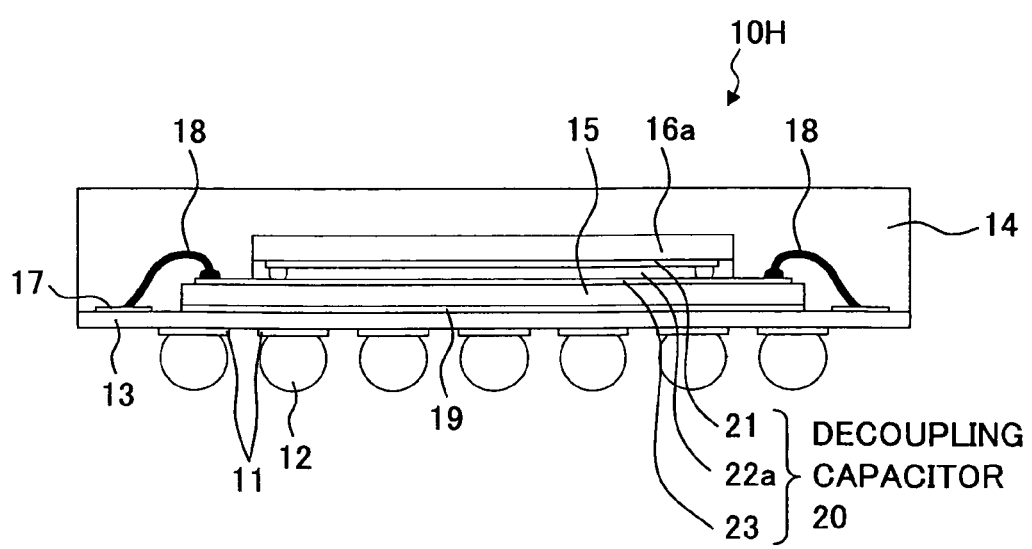
FIG. 28 is a cross-sectional view showing the composition of a semiconductor device in a ninth embodiment of the invention.
Figure 29:
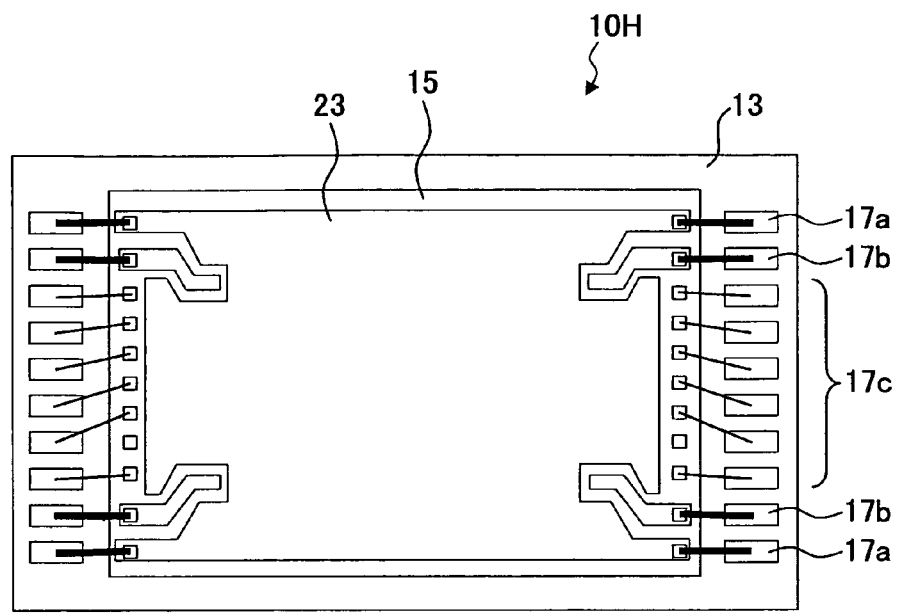
FIG. 29 is a top view showing the composition of the semiconductor device in the ninth embodiment of the invention.
Figure 30:
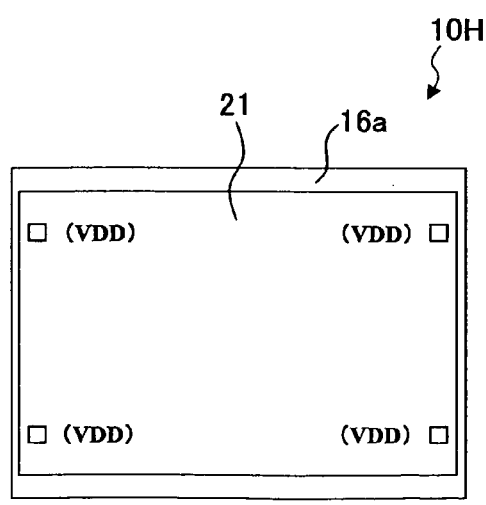
FIG. 30 is a plan view showing the back surface of the dummy chip in the semiconductor device shown in FIG. 28.

FIG. 29 shows the state of the composition of the semiconductor device shown in FIG. 28 in which the encapsulation resin 14 and the dummy chip 16a are not provided. FIG. 30 shows the composition of the back surface of the dummy chip 16a.

The semiconductor device 10H of this embodiment is provided so that the dummy chip 16a is mounted on the semiconductor chip 15 in the composition of the fifth embodiment. Other composition of this embodiment is essentially the same as that of the fifth embodiment, and a description thereof will be omitted.

In the semiconductor device 10H of the ninth embodiment, the wires 18 are not used for connection of the dummy chip 16a, the height of the semiconductor device can be reduced by the amount corresponding to the height of the wire loop. Therefore, the structure of the semiconductor device 10H of this embodiment is suitable for the case in which a thinner semiconductor package is required.

As described in the foregoing, according to the semiconductor device and its manufacturing method of the invention, the built-in capacitor (capacitive element) is formed and arranged between the first and second semiconductor chips, wherein the adhesive is used as the dielectric material of the capacitor and the conductor layers are used as the two mutually opposed electrodes of the capacitor.

By this composition, it is no longer necessary to arrange the electrode of a capacitor on the supporting substrate on which the semiconductor chip is mounted or held, and the area of the space for arranging the wiring on the supporting substrate is not restricted and the flexibility of the arrangement can be increased.

As a result, the number of layers of the supporting substrate can be reduced, and production of a small-size, thin supporting substrate can be attained at low cost, which makes it possible to provide a semiconductor device with a built-in capacitor (capacitive element) inexpensively.

The above-mentioned capacitor is inserted between the power-supply conductor layer and the ground conductor layer in the semiconductor device concerned, and this capacitor functions as a decoupling capacitor which prevents and controls the power supply bounce or the ground bounce due to the transient current, and it can remarkably contribute to the performance of the semiconductor device.

The present invention is not limited to the above-described embodiments, and variations and modifications may be made without departing from the scope of the present invention.

What is claimed is:

1. A semiconductor device, comprising:
   a supporting substrate;
   a first semiconductor chip disposed over the supporting substrate via a first adhesive layer, the first semiconductor chip being bonded to the supporting substrate by the first adhesive layer;
   a second semiconductor chip or dummy chip disposed over the first semiconductor chip via a second adhesive layer, the first semiconductor chip and the second semiconductor chip or dummy chip being bonded to each other by the second adhesive layer; and
   a capacitor formed between the first semiconductor chip and the second semiconductor chip or dummy chip, the capacitor including the second adhesive layer used as a dielectric material, a first conductor layer formed on a surface of the first semiconductor chip as one of two mutually opposed electrodes, and a second conductor layer formed on a surface of the second semiconductor chip or dummy chip as the other of the two mutually opposed electrodes,
   wherein the second adhesive layer is disposed between the first and second conductor layers of the capacitor, each of the second conductor layer and the second adhesive layer has an area which is substantially equal to an area of the second semiconductor chip or dummy chip, and the second adhesive layer fully fills a gap between the first and second conductor layers throughout the area of the second semiconductor chip or dummy chip.

2. The semiconductor device according to claim 1 wherein the one of the two mutually opposed electrodes of the capacitor is disposed on the surface of the first semiconductor chip over the supporting substrate, and the other of the two mutually opposed electrodes of the capacitor is disposed on the surface of the second semiconductor chip or dummy chip.

3. The semiconductor device according to claim 1 wherein the other of the two mutually opposed electrodes of the capacitor is disposed on the surface of the dummy chip over the supporting substrate, the one of the two mutually opposed electrodes of the capacitor is disposed on the surface of the first semiconductor chip, and the second adhesive layer is disposed between the dummy chip and the first semiconductor chip.

4. The semiconductor device according to claim 1 wherein the one of the two mutually opposed electrodes of the capacitor is electrically connected to one of a power supply electrode and a ground electrode in the semiconductor device, and the other of the two mutually opposed electrodes of the capacitor is electrically connected to the other of the power supply electrode and the ground electrode in the semiconductor device.

5. The semiconductor device according to claim 1 wherein the capacitor constitutes a decoupling capacitor in the semiconductor device.

6. The semiconductor device according to claim 1 wherein the second adhesive layer is made of a silicone resin or an epoxy resin.

* * * * *